US008193871B1

(12) United States Patent
Groe (10) Patent No.: US 8,193,871 B1
(45) Date of Patent: Jun. 5, 2012

(54) FM PULSE SHAPING (75) Inventor: John B. Groe, Poway, CA (US)

(73) Assignee: Quintic Holdings, Santa Clara, CA (US)

( * ) Notice: Subject to any disclaimer, the term of this patent is extended or adjusted under 35 U.S.C. 154(b) by 902 days.

(21) Appl. No.: 12/251,342

(22) Filed: Oct. 14, 2008

Related U.S. Application Data (60) Provisional application No. 60/979,740, filed on Oct. 12, 2007.

(51) Int. Cl.
H03C 3/38 (2006.01)
H03C 3/06 (2006.01)
H03C 1/50 (2006.01)
H04B 1/02 (2006.01)
H04L 27/04 (2006.01)

(52) U.S. Cl. ........ 332/120; 332/103; 332/126; 332/127; 332/151; 375/300; 455/42; 455/62; 455/75; 455/102; 455/108

(58) Field of Classification Search ................ 332/103, 332/117–120, 123, 126, 127, 151; 375/300; 455/42, 62, 75, 102, 108
See application file for complete search history.

(56) References Cited

U.S. PATENT DOCUMENTS

| | | | | | |
|---|---|---|---|---|---|
| 3,793,597 | A | * | 2/1974 | Toman | 332/108 |
| 4,706,262 | A | * | 11/1987 | Ohta | 375/297 |
| 5,373,532 | A | * | 12/1994 | Fujita et al. | 375/308 |
| 5,465,396 | A | * | 11/1995 | Hunsinger et al. | 455/61 |
| 5,838,728 | A | * | 11/1998 | Alamouti et al. | 375/265 |
| 6,985,705 | B2 | * | 1/2006 | Shohara | 455/164.1 |
| 6,996,382 | B2 | * | 2/2006 | Higuchi | 455/126 |
| 7,046,970 | B2 | * | 5/2006 | Nguyen et al. | 455/110 |

* cited by examiner

Primary Examiner — Levi Gannon
(74) Attorney, Agent, or Firm — Blairtech Solution LLC

(57) ABSTRACT

Apparatus and methods for improving the spectral performance of a polar modulator are described. A composite FM signal component of a composite polar transmit signal may be processed by monitoring the FM signal to detect a transient burst component, and, responsive to detection of a transient burst, generating a spectrally friendly replacement signal component that may be combined with the FM signal to improve spectral performance of the composite signal. In addition, an associated AM component of the composite transmit signal may be filtered to further improve spectral performance.

29 Claims, 10 Drawing Sheets

One Embodiment of a Pulse Shaping Circuit Implementation

FIGURE 1
WCDMA Transmit Signal Plotted on Complex Plane
(PRIOR ART)

FIGURE 2
Polar Transmitter
(PRIOR ART)

FIGURE 3a
Delta Sigma Modulator Diagram
(PRIOR ART)

FIGURE 3b
Noise Contribution of Delta Sigma Modulator

FIGURE 4a
Phase Frequency Modulation System
(PRIOR ART)

FIGURE 4b
Response of Each FM Path

FIGURE 5a
Dual Port VCO
(PRIOR ART)

FIGURE 5b
Response at Modulation Port

FIGURE 6
FM for a Typical WCDMA Signal

FIGURE 7
Output Spectrum for Polar Transmitter

FIGURE 8
FM Signal and Transient Bursts

FIGURE 9a

One Embodiment of a Pulse
Shaping Circuit Implementation

FIGURE 9b

A Generated Gaussian Pulse in
Accordance with One Embodiment
of the Present Invention

FIGURE 9c
Effect of Pulse Replacement Implemented by One
Embodiment of the Present Invention

FIGURE 9d
Modified Spectrum of Adjusted FM

FIGURE 10a
Transmitter Output Spectrum with FM Pulse Shaping

FIGURE 10b
Output Spectrum for Uncorrected Polar
Transmitter (as also shown in FIG. 7)

FM PULSE SHAPING

CROSS REFERENCE TO RELATED APPLICATIONS

This application claims priority under 35 U.S.C. §119(e) to U.S. Provisional Patent Application Ser. No. 60/979,740, entitled FM PULSE SHAPING, filed on Oct. 12, 2007. This application is also related to U.S. Utility Pat. No. 6,985,703, entitled DIRECT SYNTHESIS TRANSMITTER, issued on Jan. 10, 2006, to U.S. Utility Pat. No. 6,774,740, entitled SYSTEM FOR HIGHLY LINEAR PHASE MODULATION, issued on Aug. 10, 2004, to U.S. Utility patent application Ser. No. 12/249,725, entitled APPARATUS AND METHODS FOR POLAR MODULATION WITH IQ ZEROING, filed on Oct. 10, 2008, and to U.S. Utility patent application Ser. No. 11/369,897, entitled LINEAR WIDEBAND PHASE MODULATION SYSTEM, filed on Mar. 6, 2006. The content of each of these applications is hereby incorporated by reference herein in its entirety for all purposes.

FIELD OF THE INVENTION

The present invention relates generally to radio transmitter systems using polar modulation. More particularly but not exclusively, the present invention relates to apparatus and methods for reshaping FM impulses without adversely affecting the spectrum of an associated composite transmit signal.

BACKGROUND OF THE INVENTION

Radio transmitters are used to generate the modulated signals required for wireless communications using modulation techniques such as QPSK, 8-PSK, 16-QAM, 64-QAM, and OFDM to vary the amplitude, phase, and/or frequency of the transmitter's RF carrier.

The modulated signal represents and conveys the message data consisting of in phase (I) and quadrature (Q) data streams. In practice, these data streams pass through digital filters that shape the resulting pulses and ultimately define the spectrum of the modulated transmit signal. A polar transmitter translates these I and Q data streams to equivalent amplitude (AM) and phase (PM) modulation signals. This allows these signals to be applied at more advantageous points in the transmitter, thereby increasing its efficiency.

Figure 1:
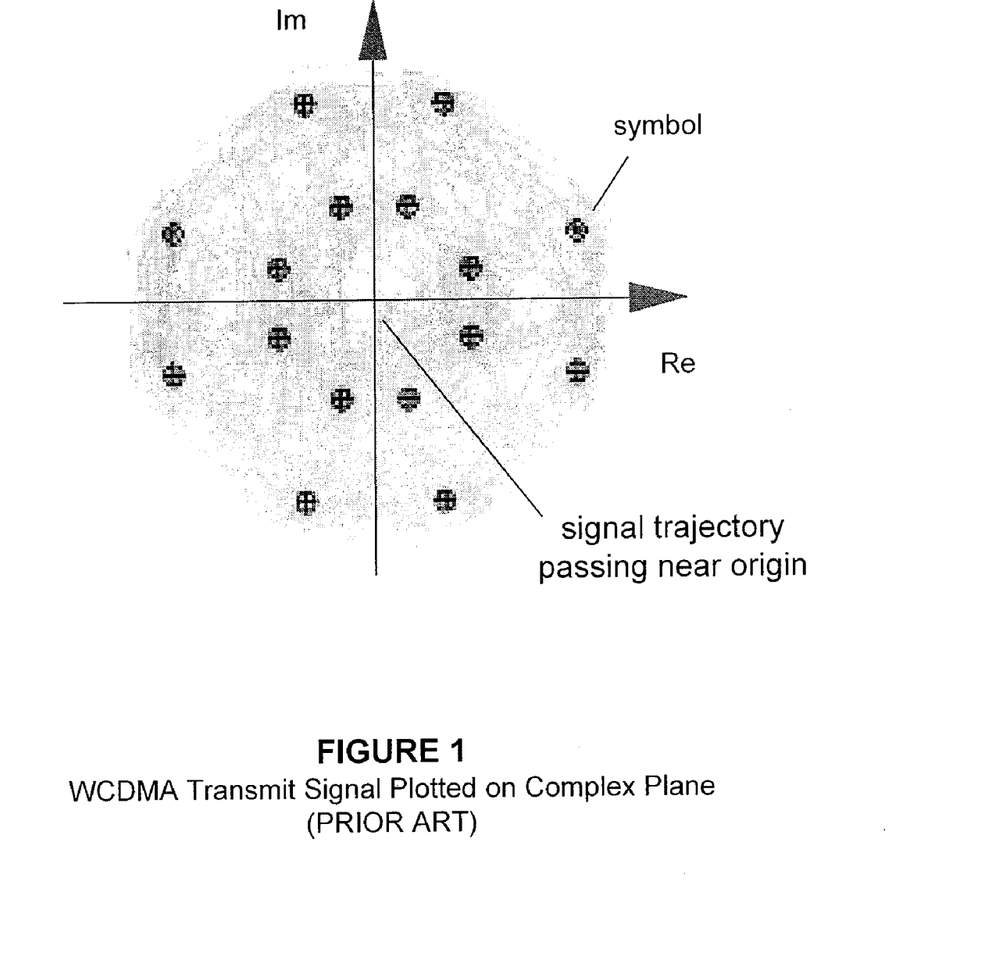
FIG. 1 shows the complex signal trajectory for a WCDMA transmit signal.

The PM signal is applied to the RF carrier at a phase-locked loop (PLL). In practice, this is actually accomplished using the equivalent frequency modulation (FM) signal, which is easily found by differentiating the PM signal. Unfortunately, the differentiation process widens the bandwidth of the FM signal and also generates impulses. This is due to the fact that the phase jumps by as much as it whenever the transmit signal passes through or near the origin of the complex plane, as shown in FIG. 1. The resulting FM impulses (that occur after differentiating the phase jumps), although infrequent, can be as strong as one-half of the data rate.

The FM signal's impulses and wide bandwidth present daunting challenges to the design of the polar transmitter. Any distortion of the FM signal alters the spectrum of the VCO output, elevates the noise floor around the transmit signal, and rotates the complex signal pattern. Practical circuits invariably reduce the bandwidth of the FM signal and degrade performance. More importantly, the VCO and PLL limit the peak FM deviation and corrupt the transmit output spectrum.

It would therefore be advantageous to reduce the peak FM deviation as well as the bandwidth of the FM signal.

SUMMARY

In one or more embodiments of the present invention, methods and apparatus for detecting FM impulses in a polar modulation system and replacing them with equivalent spectrally-friendly pulses are described, providing potential advantages including reducing the peak FM deviation as well as the bandwidth of the FM signal.

In one aspect, the present invention is directed to a method of improving the spectral performance of a polar transmitter, comprising receiving an FM signal, said FM signal being a component of a composite transmit signal; detecting a transient burst signal component of the FM signal based on a set of detection rules; generating, responsive to said detecting, a replacement pulse signal component; and combining said replacement pulse signal component with the FM signal to generate an adjusted FM signal, wherein said replacement pulse signal component is disposed to improve the spectral characteristics of the adjusted FM signal.

In another aspect, the present invention is directed to an apparatus for modifying an FM signal in a polar transmitter, the apparatus comprising a detection module configured to monitor said FM signal and identify when a parameter of said FM signal exceeds a threshold value; a sample replacement module coupled to said detection module, the sample replacement module configured to determine, based at least in part on said identifying, a sequence of one or more samples of said FM signal to be replaced; an energy measurement module coupled to said sample replacement module, the energy measurement module configured to determine a replacement signal energy metric based on said sequence of one or more samples of said FM signal; a replacement signal generation module coupled to said energy measurement module, the replacement signal generation module configured to generate a replacement signal sample sequence based at least in part on said signal energy metric; and a signal modification module coupled to said sample replacement module and said replacement signal generation module, the signal modification module configured to combine said FM signal with said replacement signal sample sequence to generate an adjusted FM signal.

In another aspect, the present invention is directed to a polar modulator comprising a phase-locked loop; a variable gain amplifier coupled to an output of the phase-locked loop; and an FM signal adjustment circuit coupled to the phase-locked loop, said FM signal adjustment circuit comprising a detection module configured to monitor said FM signal and identify when a parameter of said FM signal exceeds a threshold value; a sample replacement module coupled to said detection module, the sample replacement module configured to determine, based at least in part on said identifying, a sequence of one or more samples of said FM signal to be replaced; an energy measurement module coupled to said sample replacement module, the energy measurement module configured to determine a replacement signal energy metric based on said sequence of one or more samples of said FM signal; a replacement signal generation module coupled to said energy measurement module, the replacement signal generation module configured to generate a replacement signal sample sequence based at least in part on said signal energy metric; and a signal modification module coupled to said sample replacement module and said replacement signal generation module, the signal modification module configured to combine said FM signal with said replacement signal sample sequence to generate an adjusted FM signal.

Additional aspects of the present invention are further described below with respect to the accompanying drawings.

BRIEF DESCRIPTION OF THE DRAWINGS

The following is a brief description of the drawings wherein:

FIG. 3b shows the noise contribution of a delta sigma modulator of the PLL as shown in FIG. 3a;
FIG. 5b shows the response at the modulation port of the dual port VCO of FIG. 5a.

DETAILED DESCRIPTION

Figure 2:
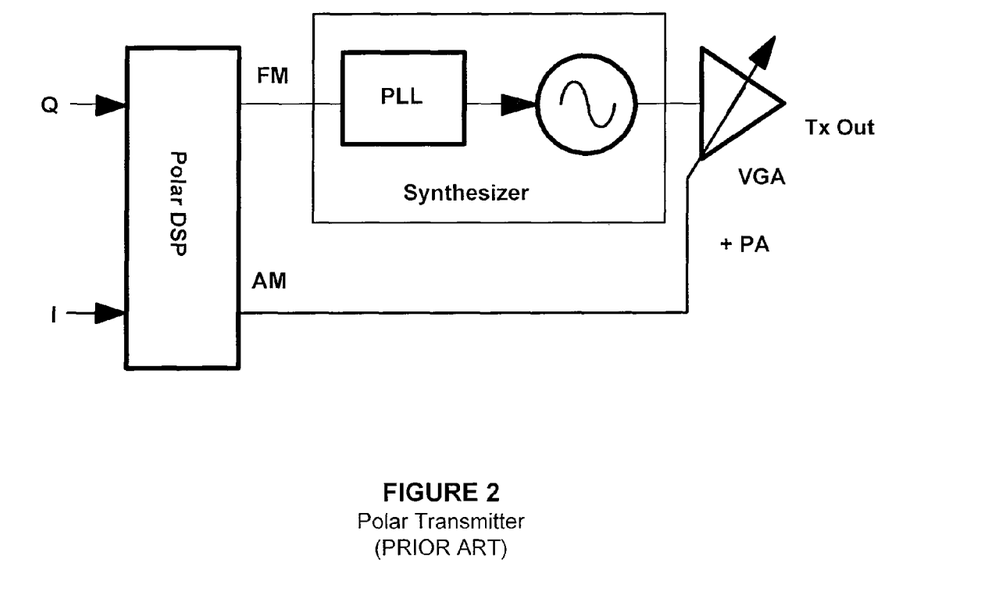
FIG. 2 shows a diagram of simple polar transmitter.

A simple diagram of a polar transmitter is shown in FIG. 2. The transmit signal is synthesized using direct phase modulation at the synthesizer and amplitude modulation at the variable gain amplifier (VGA) or power amplifier (PA).

Figure 3A:
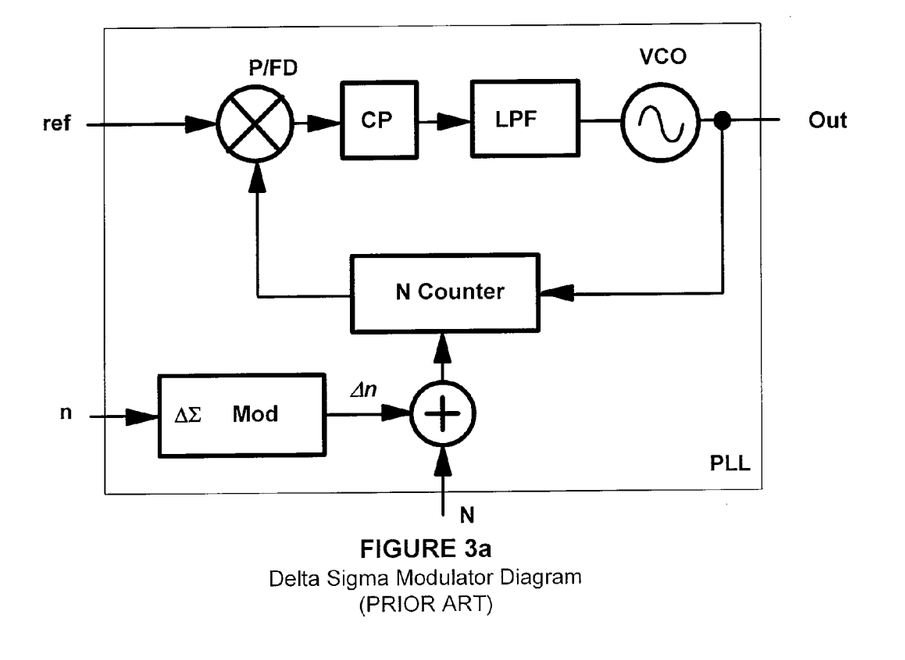
FIG. 3a shows a diagram of a fractional-N phase locked loop (PLL)

FIG. 3a shows a fractional-N phase-locked loop (PLL) used to synthesize the radio frequency (RF) carrier signal. The PLL forms a feedback system that consists of a voltage-controlled oscillator (VCO), N counter, phase/frequency detector (P/FD), charge pump (CP), and integration filter (LPF).

The PLL uses negative feedback to force the phase of the feedback signal to track the phase of the reference signal. As a result, the VCO oscillates at a frequency given by $$f_{VCO} = f_{REF}(N+n)$$

where n represents the fractional value and N equals the integer value.

The fractional-N phase-locked loop resolves fine frequency steps by modulating the value of $\Delta n$ so that its average value satisfies $$n = \frac{\Delta f}{f_{REF}} = \frac{1}{M}\sum_{i=1}^{M} \Delta n_i$$

The $\Delta\Sigma$ modulator forms a sequence of $\Delta n$ values with these important properties: 1) it responds to the input n quickly, 2) it possesses a resolution that improves with the number of samples, and 3) it concentrates quantization noise at high frequencies, near one-half the clock frequency.

The quantization noise can be attributed to the integer nature of the feedback counter. It possesses a quantization error of $\pm\frac{1}{2}$ around N or $$\Delta = \frac{1}{N}$$

Assuming a uniform distribution of this error leads to the noise spectral density function described by $$e_{rms}^2(f) = \frac{1}{12N^2 f_{REF}}$$

The $\Delta\Sigma$ modulator found in this polar transmitter shapes the quantization noise according to the transfer function $$\Delta\Sigma(z) = (1-z^{-1})^L$$

where L is the order of the modulator. It in turn feeds the feedback counter, which acts a digital accumulator and reduces its noise-shaping effects. That is, the feedback counter operates in such a way that the current output phase depends on its previous output phase. As a result, the transfer function of the feedback counter or prescalar becomes $$P(z) = 2\pi \frac{z^{-1}}{1-z^{-1}}$$

Combining the above equations shows that the noise at the output of the feedback counter equals $$n^2(f) = e_{rms}^2(f)[\Delta\Sigma(f)]^2[P(f)]^2$$

which simplifies to $$n^2(f) = \frac{1}{3}\frac{\pi^2}{N^2 f_{REF}}\left[2\sin\left(\frac{\pi f}{f_{REF}}\right)\right]^{2(L-1)}$$

Figure 3B:
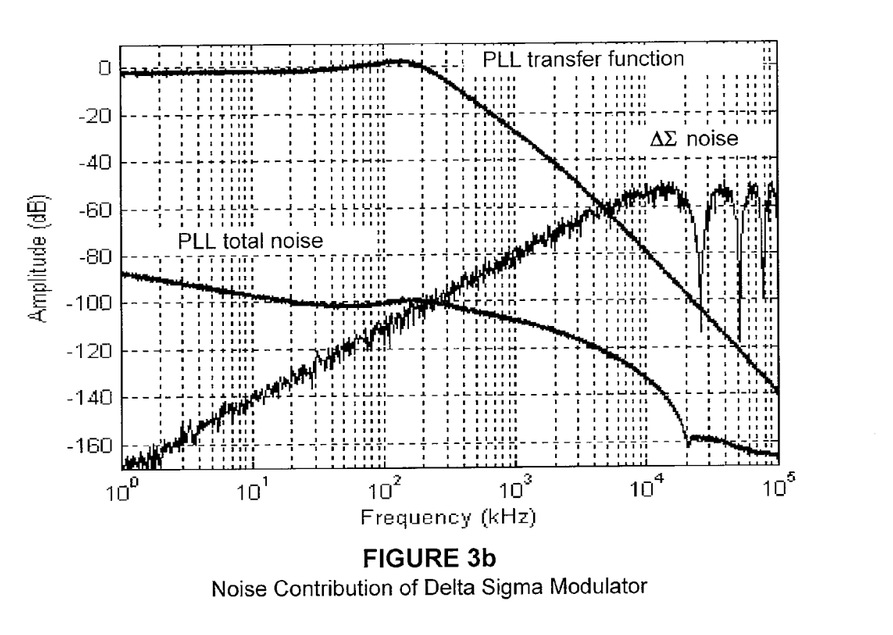

Ultimately, this noise must be attenuated by the loop filter and PLL transfer function to avoid excessive $\Delta\Sigma$ noise at the output of the PLL as shown in FIG. 3b.

Figure 4A:
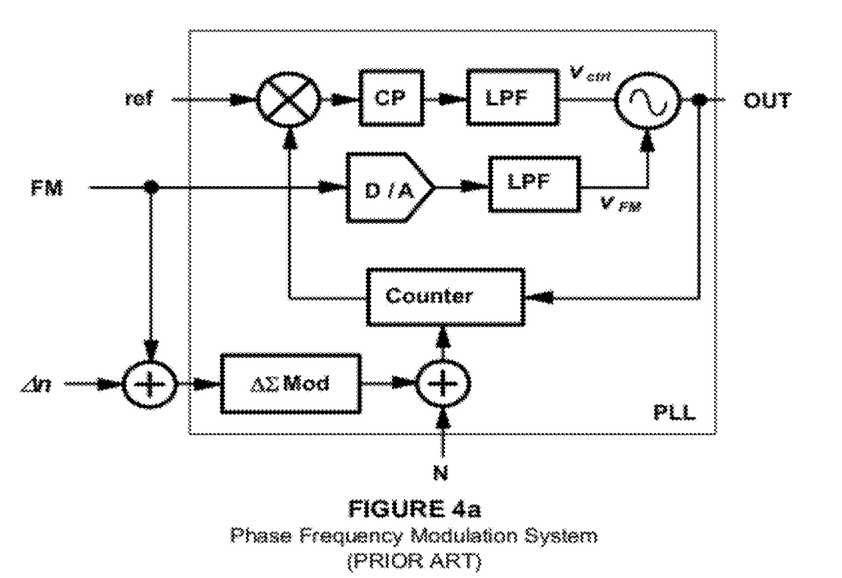
FIG. 4a shows a diagram of a phase/frequency modulator.
Figure 4B:
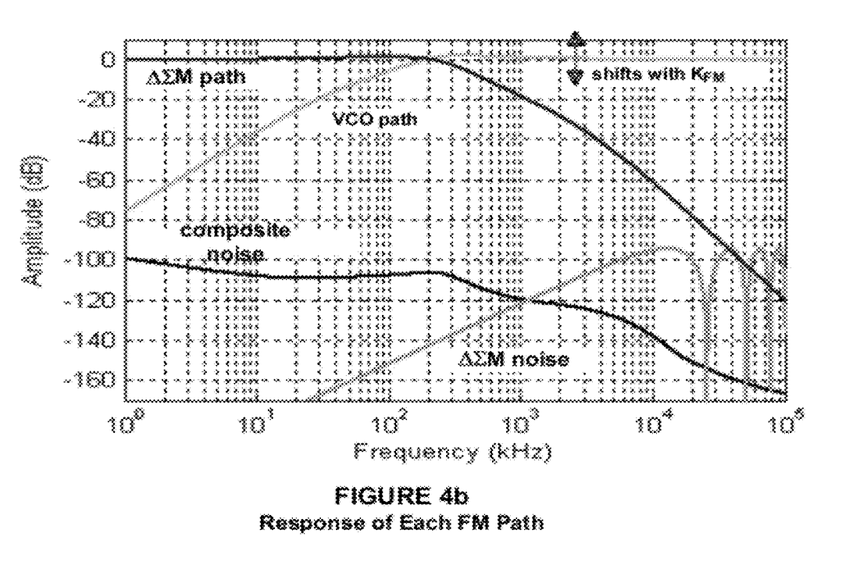
FIG. 4b shows the response of each of the modulation paths.

To support wideband direct phase/frequency modulation, the fractional-N phase-locked loop adds a direct path to the VCO as shown in FIG. 4a. This modifies the VCO output to $$v_{out}(t) = A\cos[\omega t + K_{VCO}\int v_{ctrl}(t)dt + K_{FM}\int v_{FM}(t)dt]$$

where $K_{VCO}$ and $K_{FM}$ represent the sensitivity of the control port and the direct frequency modulation port, respectively. The FM signal also feeds the $\Delta\Sigma$ modulator and the feedback counter. This results in two paths for the FM signal as illustrated in FIG. 4b and described by the transfer functions $$\Delta f = \frac{K_{PD}Z(s)K_V}{sN + K_{PD}Z(s)K_V}FM \quad \Delta f = \frac{sNK_{FM}}{sN + K_{PD}Z(s)K_V}\alpha FM$$

where $K_{PD}$ is the charge pump's gain, Z(s) is the impedance presented by the loop filter, $K_{FM}$ is the VCO's sensitivity at the tuning port, N is the value of the feedback counter, $K_{FM}$ is the VCO's gain at the modulation port, and $\alpha$ is a scaling parameter. Ideally, these two functions combine to realize a flat response. That is, the $\Delta\Sigma M$ path's response transitions smoothly to the VCO path's response and holds their combination at unity (0 dB). By its nature, the frequency modulation developed through the $\Delta\Sigma$ modulator is exact while, in contrast, the modulation formed at the VCO is sensitive to its gain $K_{FM}$ and the accuracy of scaling parameter $\alpha$.

Figure 5A:
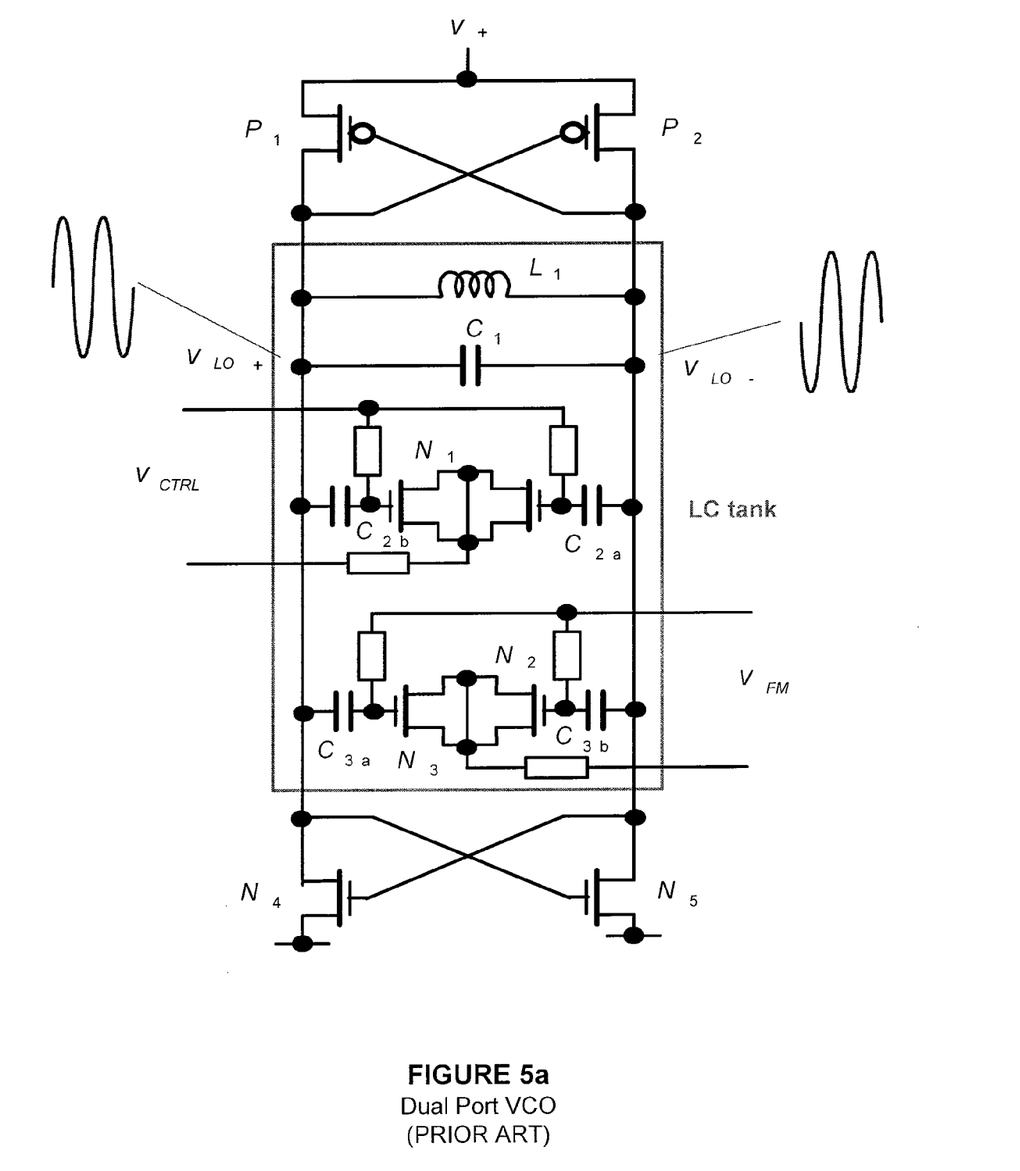
FIG. 5a shows a diagram of a dual port VCO.
Figure 5B:
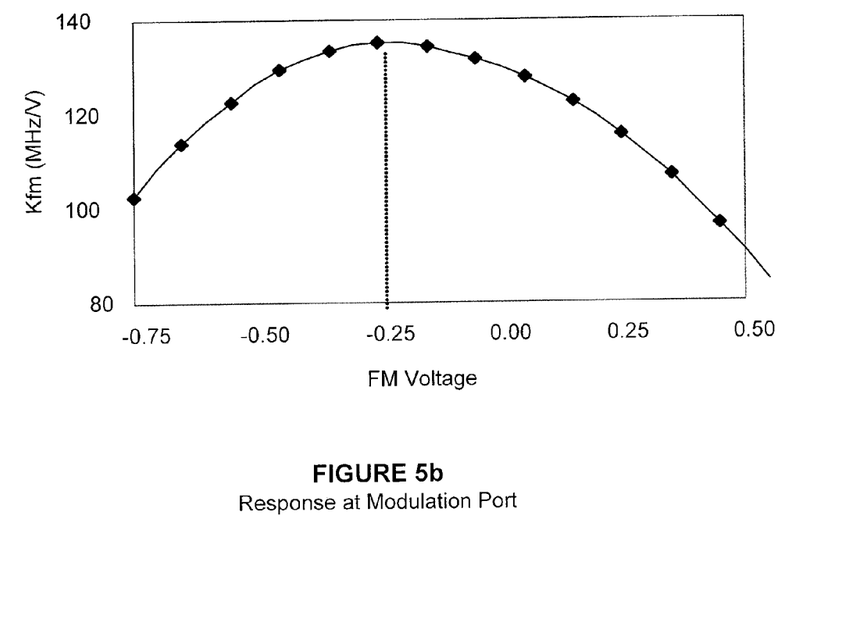

A key component of a direct phase/frequency modulator is a VCO such as the one shown in FIG. 5a. It uses complimentary MOS devices to replenish the losses in the LC resonator. The LC resonator consists of a differential inductor, coarse-tuning capacitors (not shown), and two variable capacitance structures based on accumulation-mode MOSFET devices. The accumulation-mode devices normally display an abrupt response, but impressing the large VCO signal across two back-to-back devices tends to linearize the response as shown in FIG. 5b. This is particularly important for wideband frequency modulation.

Figure 6:
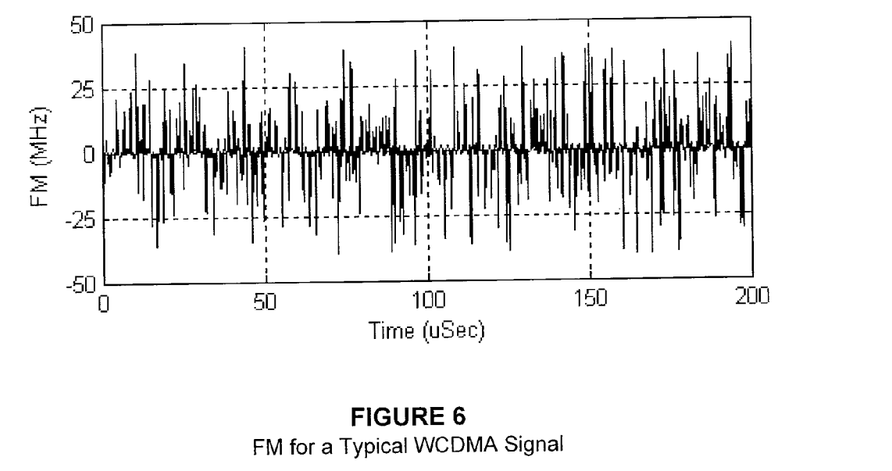
FIG. 6 shows the FM signal for a typical WCDMA transmit signal.

By design, signals applied to the control and modulation ports change the phase/frequency of the VCO output. Unfortunately, the VCO cannot discriminate between intended signals and noise. It therefore becomes important to minimize the noise as well as the sensitivity of these ports. Adding coarse-tuning capacitors to subdivide the VCO range lowers the sensitivity of the control port. Unfortunately, the nonlinear operations that form the FM signal can produce impulses as strong as one-half the FM data rate as shown in FIG. 6. This is because the FM signal equals $$FM = \frac{\theta(n) - \theta(n-1)}{2\pi T_R}$$

where $T_R$ is the period of the phase ($\theta$) and FM data. As such, a phase shift of $+\pi$ equals an FM deviation of $\pm 1/(2T_R)$. In this example, the FM data rate equals 78 MHz, producing impulses approaching ±39 MHz.

In a typical embodiment, a polar transmitter applies the amplitude modulation to the phase-modulated RF carrier. This can be described mathematically by $$S(t) = AM(t) \cos [2\pi f_c t + \int FM(t) dt]$$

where S(t) is the transmit signal and $f_c$ is the carrier frequency. It follows that the spectrum of the transmit signal is given by the convolution of the two signals $$S(f) = AM(f) * FM(f)$$

Figure 7:
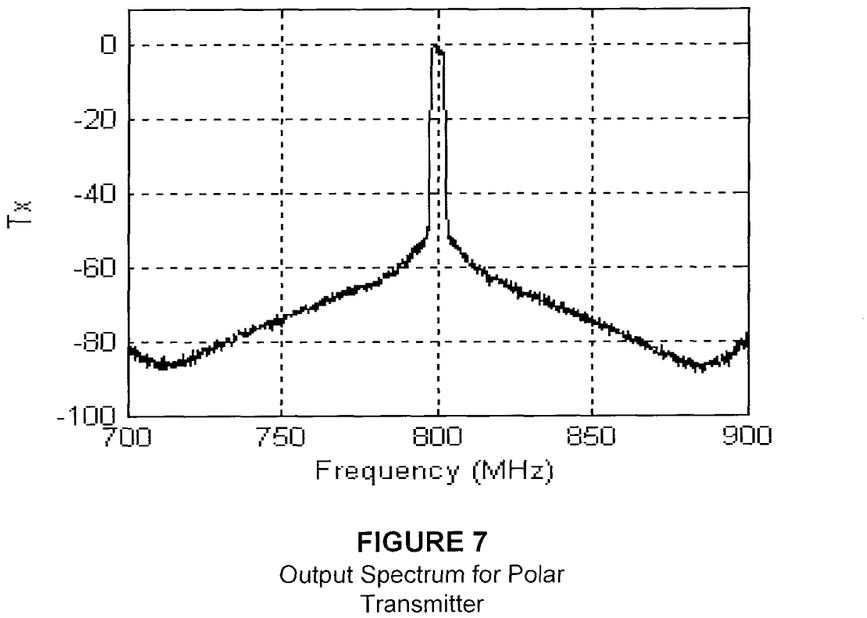
FIG. 7 shows the output spectrum for a typical polar transmitter.

Since both the AM and FM signals span a wide bandwidth, the resulting transmit signal also occupies a wide bandwidth as shown in FIG. 7.

The convolution process effectively shapes the narrowband spectrum, but invariably degrades the wider spectrum. Furthermore, the process makes it difficult to lower wideband noise. That's because any filtering applied to the AM and FM signals degrades performance and affects the composite spectrum.

Figure 8:
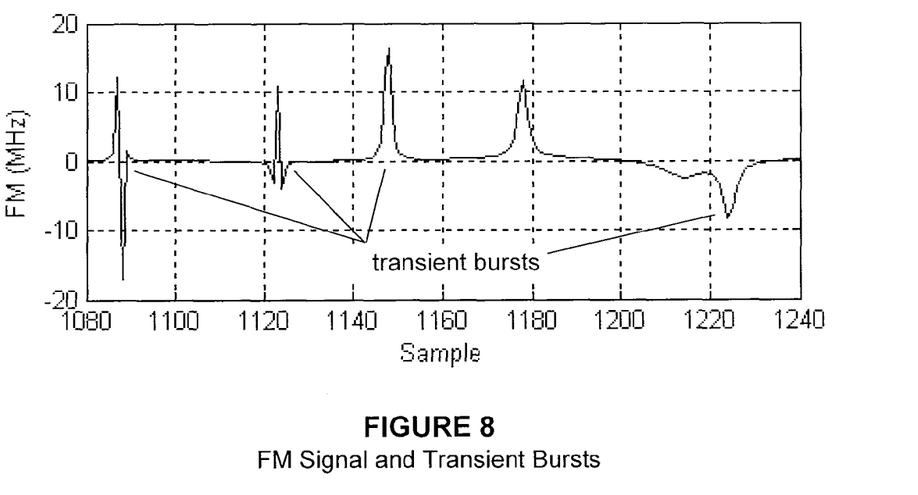
FIG. 8 shows a representative FM modulation signal and associated transient bursts in the time domain.

The heart of the problem lies with the FM signal and its time derivative relationship with the 0 or PM signal given by $$FM = \frac{d}{dt}(PM)$$

which produces the burst patterns shown in FIG. 8. A close look at the FM signal shows the signal experiences high slew-rate bursts or impulses. Furthermore, these transient bursts are responsible for the peak FM deviations as well as the wideband spectrum energy.

Low pass filters applied to the FM signal delay and attenuate any transient bursts. This in turn alters its spectrum and adversely affects the composite spectrum produced by the convolution process. It also changes the trajectory of the transmit signal, which degrades modulation accuracy and EVM. Narrowband filters introduce the most distortion.

Figure 9A:
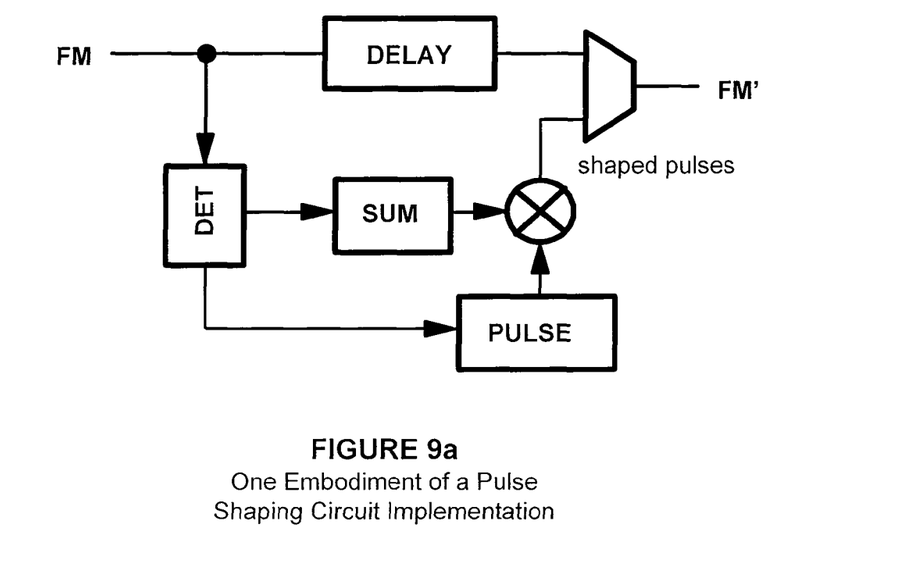
FIG. 9a shows one embodiment of an apparatus for transient pulse shaping in accordance with the present invention.

In accordance with aspects of the present invention, it is possible to replace these bursts with more spectral-friendly pulses and still preserve the modulation accuracy. In one implementation, substitute pulses with the same total energy replace the transient bursts in the FM signal. This approach essentially preserves the phase trajectory of the complex signal and helps to avoid potential EVM problems. In one embodiment, the FM pulse shaping is accomplished using the apparatus and associated process as shown in FIG. 9a. The detector element (DET) identifies the transient bursts in the FM signal. In a typical embodiment, it is configured to use a set of rules to isolate these FM samples and sums these samples to determine the total energy of the burst. This information is then used to generate and scale a spectral-friendly pulse to replace the transient burst samples in the FM signal. A delay element (DEL) then aligns the shaped pulse to its proper position in time relative to the original FM signal.

In a typical embodiment, the rules are selected to limit the properties of the FM signal or samples and define a well-behaved FM signal. In some embodiments, the rules detect if the magnitude of the FM signal exceeds an amplitude threshold. In another embodiment, the rules determine if the slew rate of the FM signal (equivalent to the difference between FM samples) exceeds a slew rate threshold. In some embodiments, the rules identify which FM samples should be included in the transient pulse and ultimately replaced by the spectral-friendly pulse. In one implementation, the process operates by considering the magnitude of the leading or trailing samples relative to the peak FM sample associated with the detected transient pulse to determine the sample range for correction. In some embodiments it may also include the polarity of the leading and trailing samples relative to the peak FM sample associated with the detected transient pulse. The number of samples to be included must be such that the scaling of the shaped pulse fits within the rules for the magnitude and slew rate of the FM signal. These embodiments can be combined to further limit the FM signal.

Figure 9B:
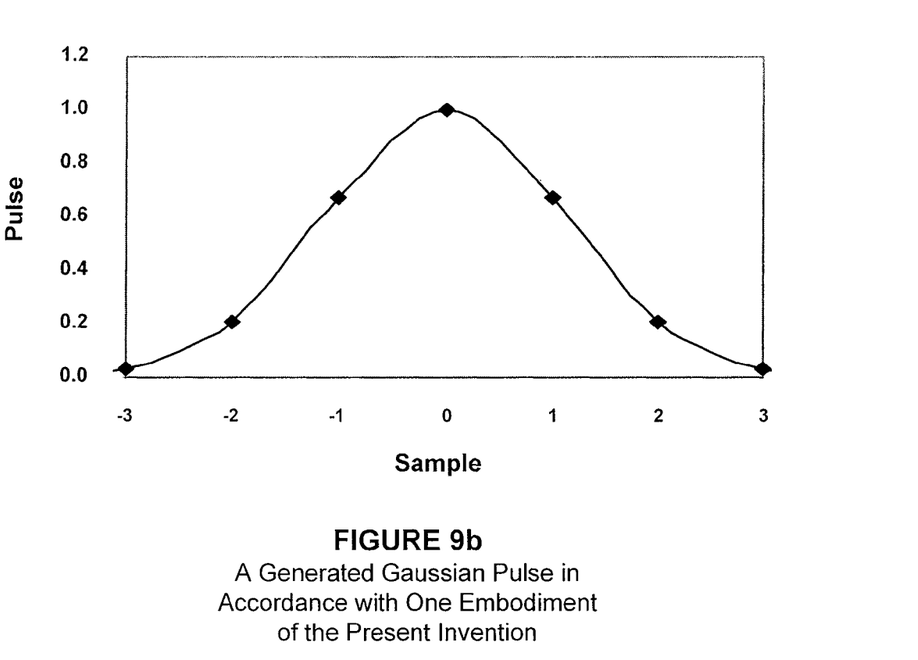
FIG. 9b shows one embodiment of a generated Gaussian pulse as may be used in embodiments of the present invention.

The burst, as well as in some cases the neighboring samples, are then mapped to a replacement pulse, such as the Gaussian pulse shown in FIG. 9b. It is noted that, while in an exemplary embodiment a Gaussian pulse may be used, other pulse shapes may also be used in some embodiments. To preserve total energy, this requires that $$FM'(n) = FM_{Total} g(n)$$

where $FM_{Total}$ equals $$FM_{Total} = \sum_{burst} FM(n)$$

and g represents the normalized Gaussian pulse (the normalized Gaussian pulse consists of a sequence of samples that sum to unity. Its length matches the number of samples in the burst. It is noted, however, that other normalized pulse types are contemplated and can be used). The normalized Gaussian pulse produces a spectrum-contained equivalent n-sample sequence described by $$g(n) = \frac{\sqrt{2}}{\alpha} e^{\left(-\frac{2\pi n^2}{\alpha^2}\right)}$$

where $\alpha$ varies with the number of samples.

In processing the signal, a targeted transient burst is detected if a rule is violated, or in a typical implementation when an amplitude or slew rate threshold is exceeded. The rules can be applied to analyze the amplitude as well as the slew rate of the FM signal. Once a transient burst is detected, the signal is then further analyzed to determine whether to include other samples (before or after the detected pulse) so that the new Gaussian pulse satisfies the rules. In practice, the length of the new pulse may be changed dynamically, but typically spans a short period of 2-8 samples. This may be done by, for example, measuring the energy of adjacent samples and adjusting the Gaussian pulse amplitude by the combined sample values.

Figure 9C:
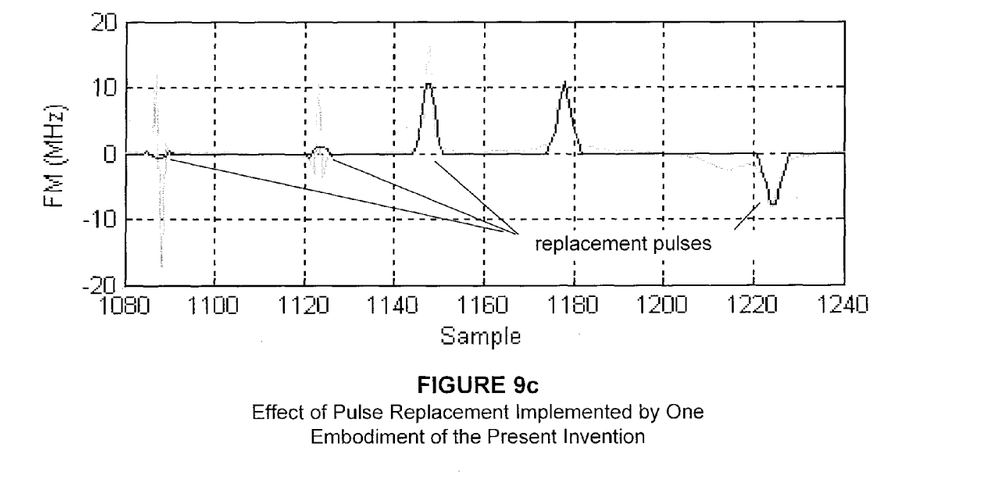
FIG. 9c shows a representation of time domain signals with and without pulse insertion as implemented by one embodiment of the present invention.
Figure 9D:
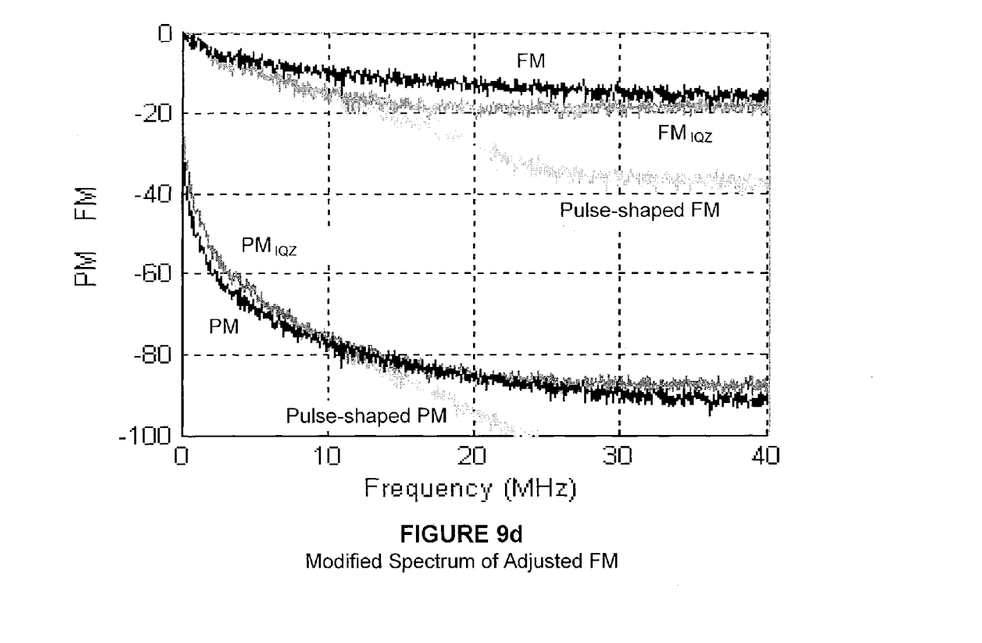
FIG. 9d shows spectral performance improvement of adjusted FM and PM signals as provided by one embodiment of the present invention.

As shown with respect to one embodiment, the FM pulse shaping process can dramatically re-shape the FM signal, as illustrated in FIG. 9c. It can also reduce the wideband spectrum significantly as shown in FIG. 9d.

Figure 10A:
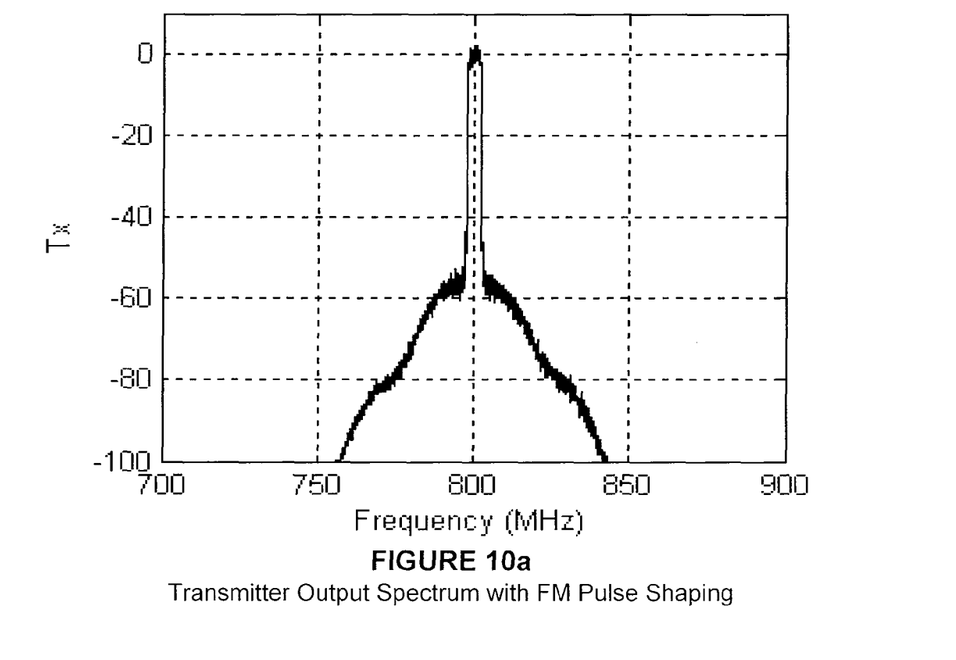
FIG. 10a shows an enhanced polar transmitter output spectrum as implemented by one embodiment of the present invention.
Figure 10B:
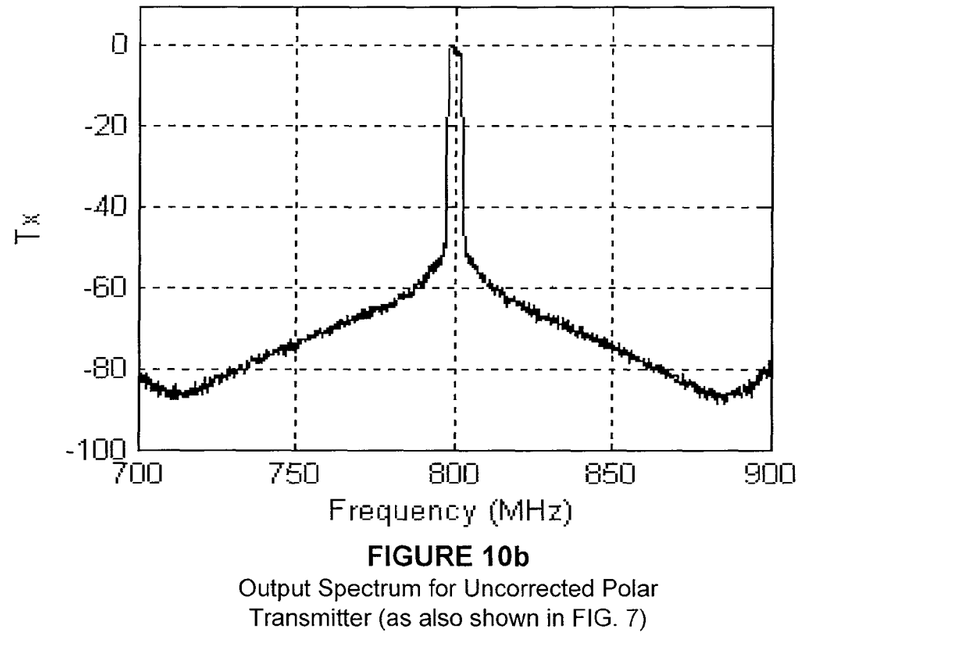
FIG. 10b shows a non-enhanced polar transmitter output spectrum.

With less wideband energy, the bandwidth of both the AM and FM signals can be reduced (by, for example, low pass filters) without seriously degrading performance. As a result, the wideband noise falls dramatically as illustrated in FIG. 10a (with FIG. 10b illustrating the uncorrected spectrum as is also shown in FIG. 7).

In summary, by applying apparatus and methods in accordance with the present invention, FM pulse shaping can be used to replace strong FM transient bursts or impulses with equivalent, more spectrally-friendly and easily produced pulses with smaller peaks and less wideband energy. This approach can improve the performance of the polar transmitter.

Some embodiments of the present invention may include computer software and/or computer hardware/software combinations configured to implement one or more processes or functions associated with the present invention, including those described above. These embodiments may be in the form of modules implementing functionality in software, hardware, and/or hardware software combinations. Embodiments may also take the form of a computer storage product with a computer-readable medium having computer code thereon for performing various computer-implemented operations, such as operations related to functionality as describe herein. The media and computer code may be those specially designed and constructed for the purposes of the present invention, or they may be of the kind well known and available to those having skill in the computer software arts, or they may be a combination of both.

Examples of computer-readable media within the spirit and scope of the present invention include, but are not limited to: magnetic media such as hard disks; optical media such as CD-ROMs, DVDs and holographic devices; magneto-optical media; and hardware devices that are specially configured to store and execute program code, such as programmable microcontrollers, application-specific integrated circuits ("ASICs"), programmable logic devices ("PLDs") and ROM and RAM devices. Examples of computer code may include machine code, such as produced by a compiler, and files containing higher-level code that are executed by a computer using an interpreter. Computer code may be comprised of one or more modules executing a particular process or processes to provide useful results, and the modules may communicate with one another via means known in the art. For example, some embodiments of the invention may be implemented using assembly language, Java, C, C#, C++, or other programming languages and software development tools as are known in the art. Other embodiments of the invention may be implemented in hardwired circuitry in place of, or in combination with, machine-executable software instructions.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

What is claimed is:

1. A method of improving the spectral performance of a polar transmitter, comprising:
   receiving an FM signal, said FM signal being a component of a composite transmit signal;
   detecting a transient burst signal component of the FM signal based on a set of detection rules;
   generating, responsive to said detecting, a replacement pulse signal component; and
   replacing a sequence of one or more samples of said FM signal with said replacement pulse signal component to generate an adjusted FM signal based on replacing rules;
   wherein said replacement pulse signal component is disposed to improve the spectral characteristics of the adjusted FM signal.

2. The method of claim 1 wherein said generating comprises:
   determining the energy of the transient burst signal component;
   selecting a normalized replacement pulse signal component; and
   scaling the normalized replacement pulse signal component amplitude based at least in part of said energy of the transient burst signal component.

3. The method of claim 1 wherein said generating comprises:
   determining the energy of the transient burst signal component;
   determining the duration of the transient burst signal component;
   selecting a normalized replacement pulse signal component; and
   scaling the time, amplitude or time and amplitude of the normalized replacement pulse signal component based on said energy of the transient burst signal component, the duration of the transient burst signal component or the energy and duration of the transient burst signal component.

4. The method of claim 2 or 3 wherein the normalized replacement pulse signal component has a Gaussian pulse characteristic.

5. The method of claim 3 wherein the transient burst signal component has a transient burst time duration of 2 or more samples and the length of the scaled normalized replacement pulse signal component has a fixed time duration.

6. The method of claim 3 wherein the transient burst signal component has a time duration of 2 or more samples and the length of the scaled normalized replacement pulse signal component has an time duration equal to the transient burst signal component time duration.

7. The method of claim 3 wherein the time duration of the scaled normalized replacement pulse transient is dynamically adjusted.

8. The method of claim 1 wherein said adjusted FM signal is filtered to remove out of band energy.

9. The method of claim 8 wherein said adjusted FM signal is lowpass filtered.

10. The method of claim 8 wherein said adjusted FM signal is bandpass filtered.

11. The method of claim 8 wherein an AM component signal of the composite transmit signal is filtered to remove out of band energy.

12. The method of claim 11 wherein said AM component signal is lowpass filtered.

13. The method of claim 11 wherein said AM component signal is bandpass filtered.

14. An apparatus for modifying an FM signal in a polar transmitter, the apparatus comprising:
- a detection module configured to monitor said FM signal and identify when a parameter of said FM signal exceeds a threshold value;
- a sample replacement module coupled to said detection module, the sample replacement module configured to determine, based at least in part on said identifying, a sequence of one or more samples of said FM signal to be replaced;
- an energy measurement module coupled to said sample replacement module, the energy measurement module configured to determine a replacement signal energy metric based on said sequence of one or more samples of said FM signal;
- a replacement signal generation module coupled to said energy measurement module, the replacement signal generation module configured to generate a replacement signal sample sequence based at least in part on said replacement signal energy metric; and
- a signal modification module coupled to said FM signal, said sample replacement module and said replacement signal generation module, the signal modification module configured to replace said sequence of one or more samples of said FM signal with said replacement signal sample sequence to generate an adjusted FM signal.

15. The apparatus of claim 14 wherein said replacement signal energy metric comprises a signal energy measurement of said one or more samples.

16. The apparatus of claim 15 wherein said energy measurement module comprises an energy metric circuit configured to generate ones of energy value for ones of said one or more samples and sum said ones of energy values to generate the signal energy measurement.

17. The apparatus of claim 14 wherein said replacement signal generation module comprises:
- a signal synthesis module configured to generate a sequence of one or more replacement signal sample values; and
- a scaling module configured to scale said one or more replacement signal sample values based at least in part on said replacement signal energy metric.

18. The apparatus of claim 17 wherein the sequence of one or more replacement signal sample values comprise a set of Gaussian pulse sample values.

19. The apparatus of claim 14 wherein the signal modification module comprises a circuit configured to:
- delay the FM signal;
- receive the replacement signal sample sequence; and
- combine the replacement signal sample sequence with the delayed FM signal to generate the adjusted FM signal.

20. The apparatus of claim 19 wherein the circuit is configured to combine the replacement signal sample sequence with the delayed FM signal by replacing said one or more samples of said FM signal with the replacement signal sample sequence.

21. The apparatus of claim 14 further comprising an output filter coupled to the output of the signal modification module to filter out of band energy from the adjusted FM signal.

22. The apparatus of claim 21 wherein the filter is a lowpass filter.

23. The apparatus of claim 21 wherein the filter is a bandpass filter.

24. The apparatus of claim 21 further comprising a second output filter coupled to an AM component signal of the composite transmit signal.

25. The apparatus of claim 24 wherein the second output filter is a lowpass filter.

26. The apparatus of claim 24 wherein the second output filter is a bandpass filter.

27. A polar modulator comprising:
- a phase-locked loop;
- a variable gain amplifier coupled to an output of the phase-locked loop; and
- an FM signal adjustment circuit coupled to the phase-locked loop, said FM signal adjustment circuit comprising:
- a detection module configured to monitor said FM signal and identify when a parameter of said FM signal exceeds a threshold value;
- a sample replacement module coupled to said detection module, the sample replacement module configured to determine, based at least in part on said identifying, a sequence of one or more samples of said FM signal to be replaced;
- an energy measurement module coupled to said sample replacement module, the energy measurement module configured to determine a replacement signal energy metric based on said sequence of one or more samples of said FM signal;
- a replacement signal generation module coupled to said energy measurement module, the replacement signal generation module configured to generate a replacement signal sample sequence based at least in part on said replacement signal energy metric; and
- a signal modification module coupled to said FM signal, said sample replacement module and said replacement signal generation module, the signal modification module configured to replace said sequence of one or more samples of said FM signal with said replacement signal sample sequence to generate an adjusted FM signal.

28. The polar modulator of claim 27 further comprising a filter coupled to the signal modification module to filter out of band energy from the adjusted FM signal.

29. The polar modulator of claim 28 further comprising a second output filter coupled to an AM signal component of the composite transmit signal to filter out of band energy from the AM signal component.

* * * * *